United States Patent [19] [11] Patent Number: 4,552,987
Stebegg et al. [45] Date of Patent: Nov. 12, 1985

[54] INITIATOR FOR A CONTACTLESS SWITCH

[75] Inventors: Josef Stebegg, Erlangen; Wolfgang Miek, Amberg, both of Fed. Rep. of Germany

[73] Assignee: Siemens Aktiengesellschaft, Munich and Berlin, Fed. Rep. of Germany

[21] Appl. No.: 630,904

[22] Filed: Jul. 13, 1984

[30] Foreign Application Priority Data

Jul. 22, 1983 [DE] Fed. Rep. of Germany ....... 3326401

[51] Int. Cl.⁴ .............................................. H05K 5/00
[52] U.S. Cl. ................................. 174/52 R; 340/693; 361/179
[58] Field of Search ............... 174/50, 52 R; 200/303; 328/5; 361/179, 180, 181; 307/116; 340/693

[56] References Cited

U.S. PATENT DOCUMENTS 4,090,091 5/1978 Brown et al. ................. 174/52 R X
4,314,310 2/1982 Schmidt ........................ 174/52 R X Primary Examiner—A. T. Grimley
Assistant Examiner—D. A. Tone
Attorney, Agent, or Firm—F. W. Powers; J. L. James

[57] ABSTRACT

An initiator for a contactless switch comprises a support section (3) and an adjacent, conical-shaped control section (5), which has a sensor surface (11) and is free to move into several positions with respect to the front side of the support section. In one position, the sensor surface is turned away from the support section and in other positions it is parallel to the lateral surfaces of the support section. The control section is equipped with a prism-shaped recess in which is fitted a fastening element (4). The fastening element can be rotated about a longitudinal axis (6) that is perpendicular to the front side of the support section, and the control section can be rotated with respect to the fastening element about a central axis (7) which extends in the direction of a diagonal across the lateral face of the control section. A corner of the support section, which is adjacent to the fastening element, is bevelled in such a manner that, after the prism-shaped fastening element has been rotated through a predetermined angle about the longitudinal axis (6), the control section can likewise be rotated about the central axis (7) by an angle of 180° and, after that, both the fastening element and the control section can together be rotated about the longitudinal axis (6). By this means it is possible to move the sensor surface of the control section into five different positions with respect to the support section.

11 Claims, 9 Drawing Figures

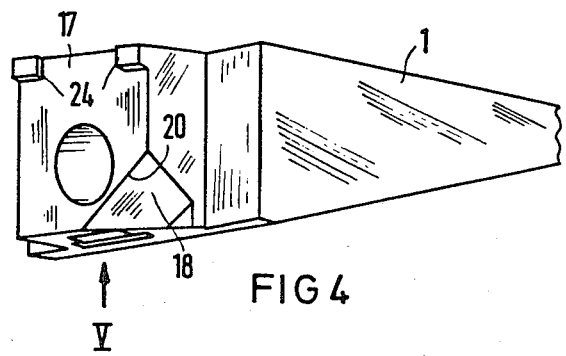
FIG 4
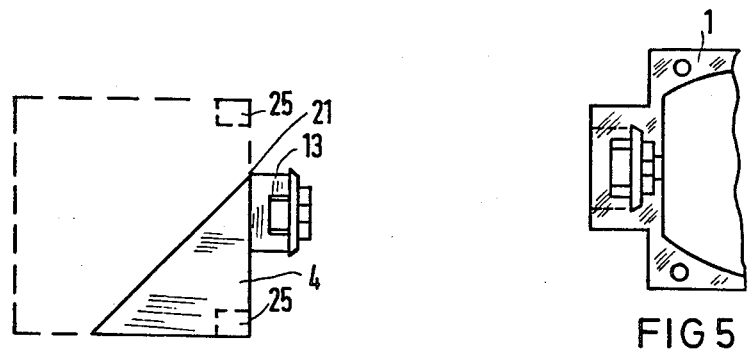
FIG 6
FIG 5
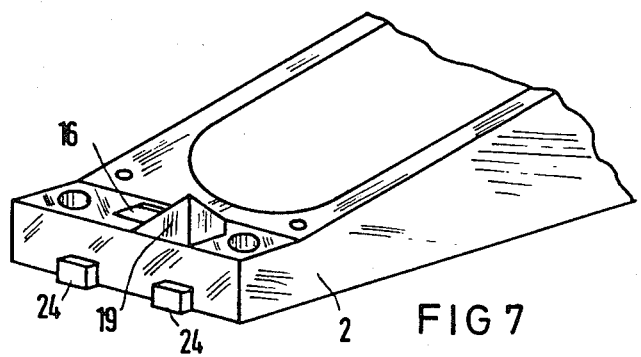
FIG 7

INITIATOR FOR A CONTACTLESS SWITCH

BACKGROUND OF THE INVENTION

The invention concerns an initiator for a contactless switch. This type of device, which is known in the art, comprises a support section and an adjacent control section, with the latter having a sensor surface and being free to move into several positions with respect to the front side of the support section. In one position, the sensor surface is turned away from the support section and in other positions it is parallel to the lateral surfaces of the support section. A fastening element, designed as a three-sided prism, is mounted in a recess between the control section and the support section. The fastening element is mounted on the front side of the support section so that it can rotate about a first, longitudinal axis that is perpendicular to this front side. The control section is mounted with respect to the fastening element in such a manner that it can be rotated about a second axis that forms an acute angle with the first axis.

An initiator of this kind is described in the German Auslegeschrift No. 29 09 048. In this device at least the control section is attached to the fastening element by a screw oriented along the second axis, which is at an angle of 45° with respect to the first axis. This screw is mated with threads in the control section that define an axis at an angle to the sensor surface.

SUMMARY OF THE INVENTION

An object of the invention is to improve an initiator of the type described above so that, while retaining the freedom to move to different positions, the screw connections between the support section, the fastening element and the control section can be omitted.

This object, as well as other objects of the invention which will become apparent from the discussion that follows, are achieved, according to the invention, by having a corner of the support section that is adjacent to the fastening element bevelled in such a manner that, after the prism-shaped fastening element has been rotated through a predetermined angle about the first, longitudinal axis, the control section, which is also mounted so that it can be rotated about the second, central axis of the fastening element, can be rotated by 180°, and after that can be rotated together with the fastening element about the longitudinal axis.

An aesthetically satisfactory overall design, with a simple means of changing the position, is produced if the support section consists of two separable parts—namely, an upper and a lower part—one of which is bevelled, as described above, to permit the change in position of the control section when the two parts are separated. A projection corresponding to and matching the bevelling is formed on the opposite (upper or lower) part and fills in the space produced by the bevelling of the support section when the two parts are assembled together.

Only a relatively small amount of bevelling is necessary if a neck-shaped intermiediate piece is formed on the support section in the area adjacent the fastening element and control section. Manufacturing can be simplified if the rotating joints between the control section and fastening element and between the fastening element and the support section consists of snap connections, which are preferably not detachable. In this case, it is not necessary to provide reserve length on the electrical connecting lead between the control section and the support section. The control section itself is thus held firmly in the determined position after the initiator has been fastened to a support surface.

A simple, advantageous holding device to block the rotary movement and/or axial movement between the control and support sections is provided by means of a stop on that upper or lower part that does not support the rotatable joint between the support section and the fastening element. For better stability against rotation, even prior to assembly or when the control section projects over the fastening surface during assembly, it is advantageous if projections and/or recesses are provided on the upper and/or lower parts, whose height or depth, respectively, is determined in such a manner that, when there is an axial displacement limited by the stop between the upper part and the control section and fastening element, the projections are pulled out of the recesses.

In order to avoid damage to the connecting lead between the control section and the fastening element or the fastening element and the support section, as the case may be, it is desirable to provide stops to limit the rotation.

For a full understanding of the present invention, reference should now be made to the following detailed description of one preferred embodiment of the invention and to the accompanying drawings.

BRIEF DESCRIPTION OF THE DRAWINGS

FIG. 4 is a perspective view of the upper part of the support section of the initiator shown in FIGS. 1-3.

FIG. 5 is a bottom view of a portion of the upper part shown in FIG. 4.

FIG. 6 is a side view of the prism-shaped fastening element of the initiator shown in FIGS. 1-3.

FIG. 7 is a perspective view of a portion of the lower part of the support section of the initiator shown in FIGS. 1-3.

DESCRIPTION OF THE PREFERRED EMBODIMENT

Figure 8:
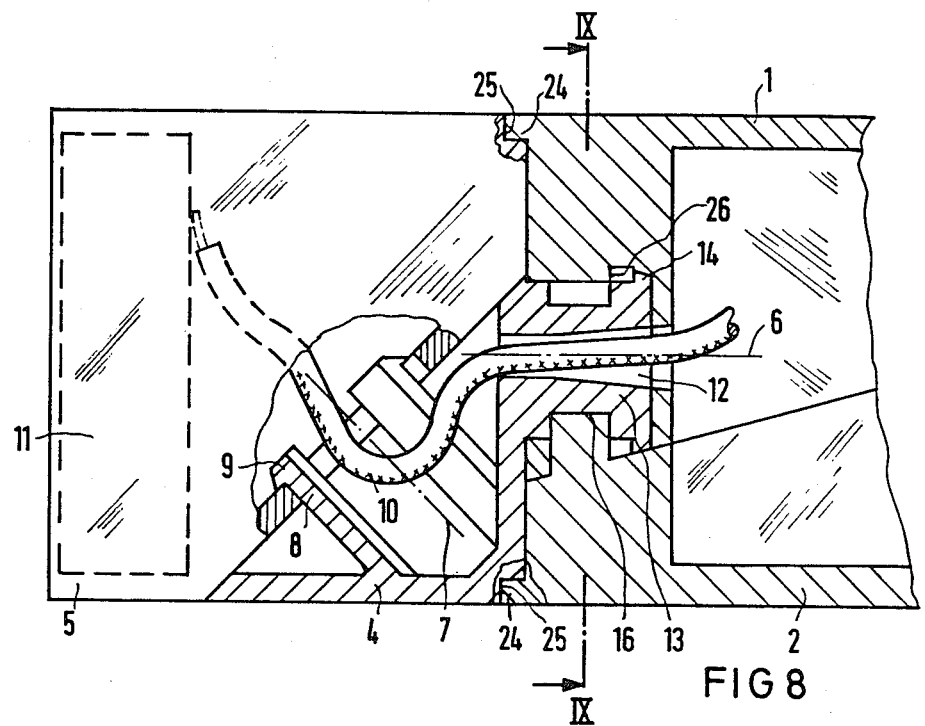
FIG. 8 is a cross-sectional view through the control section, fastening element and support section, illustrating the respective connections between the fastening element and the control section and the fastening element and the support section.

The initiator for a contactless switch according to the invention comprises a support section 3, which in turn consists of an upper part 1 and a lower part 2. The upper part 1 is connected with a fastening element 4 and the fastening element 4 with a control section 5 by means of rotatable snap connections, as may be seen in FIG. 8. The axis of rotation 6 between the fastening element 4 and the support section 3 runs longitudinally through the support section along its central axis. The axis of rotation 7 between the control section 5 and the fastening element 4 runs in a direction inclined at an angle of 45° with respect to the axis of rotation 6 and parallel to a diagonal across one of the square side surfaces of the cube formed by the control section 5 and the fastening element 4.

The fastening element 4 has an O-shaped slitted stop 8 which forms a catch hook 9. An electrical connecting lead 10 between a sensor coil 11 within the control section 5 and an evaluation circuit (not shown) within the upper part 1 extends through the slitted stop 8 and passes between the control section and support section along the axis of rotation 6 through an ear-shaped opening 12 in a rotary stud 13 on the fastening element 4. Catch hooks used to form this rotatable connection are indicated by the reference number 14.

Figure 9:
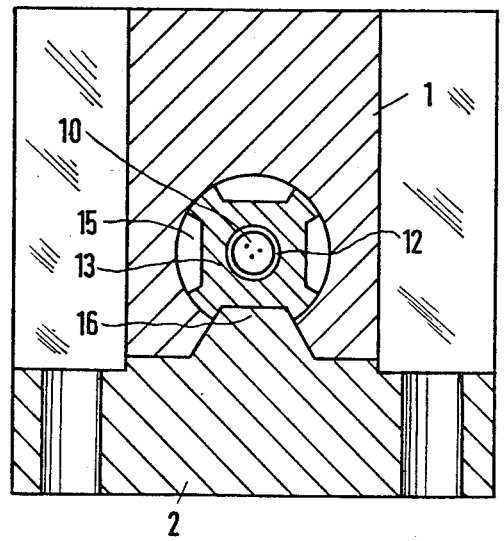
FIG. 9 is a cross-sectional view taken along the line IX-IX in FIG. 8.

As shown in FIG. 9, the rotary stud 13 is provided with notches 15 separated into quadrants which receive a projecting stop 16 formed on the lower part 2, when the upper and lower part are assembled, in such a manner as to prevent the rotation of the fastening element 4 with respect to the support section 3. The outer surfaces of the fastening element and the control section are aligned, when in the locked position, with the lateral surfaces of the support section 3. It is also possible to lock the respective sections in position, for example, at intervals of 45°, so that the control section can be rotated and locked at successive 45° positions.

The stop 16 is also designed to prevent an axial displacement between the fastening element 4 and the support section 3. Such axial displacement is necessary, however, when projections 24 on the support section 3 are to be withdrawn from recesses 25 in the fastening element 4. These projections are recesses, when engaged, are intended to provide an even more efficient means of preventing rotation between the fastening element 4 and the support section 3.

Therefore, when the direction of the sensor (11) is to be changed, the upper part 1 together with the control section 5 and the fastening element 4 are moved away from the lower part 2. The rotary stud 13 of the fastening element 4 is drawn out of the upper part 1 as far as the stop 26, and can thus be rotated to the desired position.

As FIG. 4 shows, a neck-shaped intermediate part 17 has been formed on the upper part 1, which has a bevelled portion 18. On the lower part 2 of the casing there is provided an appropriate projection 19 that fits into the bevelled portion 18 so that, after the upper and lower parts have been put together, the bevelled portion is again filled in.

Figure 1:
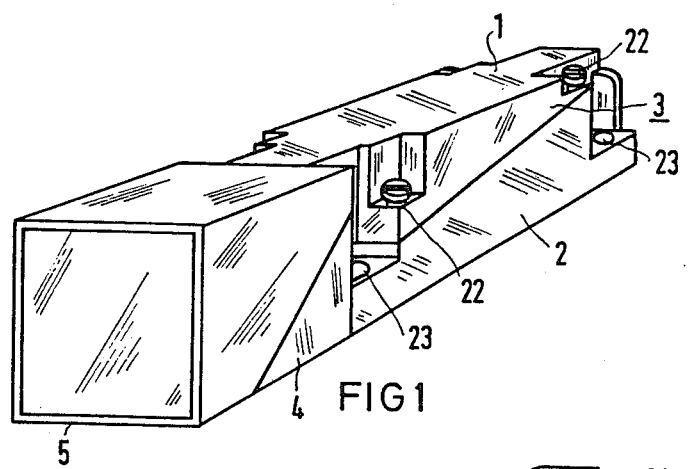
FIG. 1 is a perspective view of the preferred embodiment, according to the present invention, of an initiator for a contactless switch in which the sensor surface is arranged in front.
Figure 2:
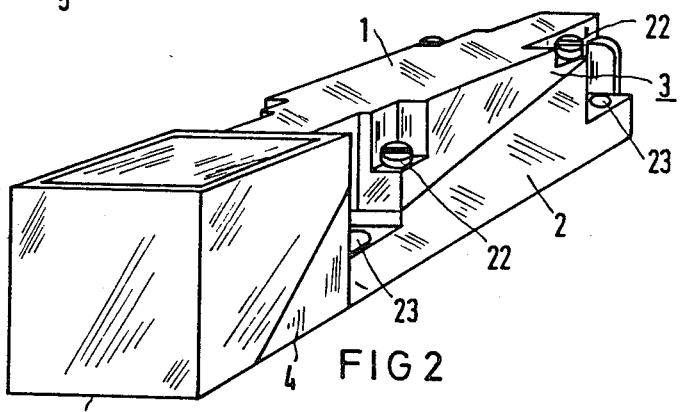
FIG. 2 is a perspective view of the initiator shown in FIG. 1 with its control section rotated by 180° with respect to its fastening element.
Figure 3:
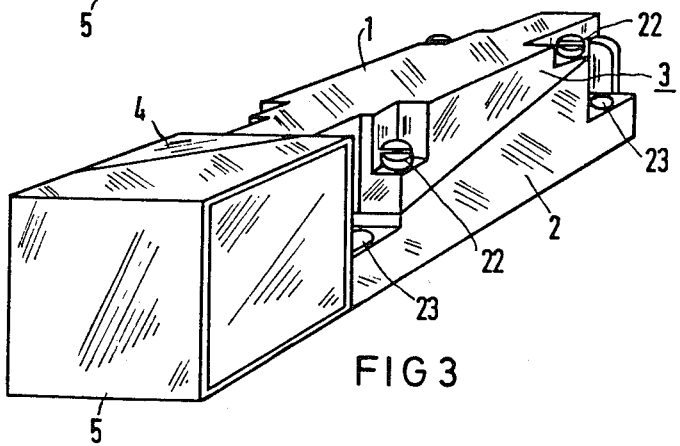
FIG. 3 is a perspective view of the initiator shown in FIGS. 1 and 2 with its control section and fastening element rotated by an angle of 90° with respect to its support section as compared to their positions in FIG. 2.

As may be seen especially from FIG. 6, the fastening element 4 is in the shape of a prism with a triangular profile, where one edge 21 meets with the longitudinal edge of the rotary stud 13 as well as the edge 20 of the bevelled portion 18. With this configuration, after the fastening element 4 has been rotated with respect to the upper part 1 of the casing about the rotary stud 13 until the edge 21 thereof is aligned with the edge 20 of the bevelled portion 18, it is possible to rotate the control section 5 with respect to the fastening element 4 about the axis 7. As a result, when the upper part 1 is removed from the lower part 2, the control section can be oriented to any of the positions shown in FIGS. 1–3. In this way, the sensor coil 11 can be oriented or "aimed" successively at all four lateral surfaces as well as the front surface of the control section 5. To do this, all that is necessary is to loosen the fastening screws 22 that connect the upper part 1 to the lower part 2.

The upper part 1 and lower part 2 may be connected with one another in a conventional manner by means of plug connections with the electrical lead to the switch being introduced into the lower part 2. It is not necessary to unfasten the connection between the lower part 2 and the surface on which it is installed (e.g. by means of screws in the fastening holes 23) when moving the control section 5.

In order to be able to maintain the position of the control section 5 with respect to the upper part 1, even when the upper part is removed, it is advantageous if catch stops (not shown) are provided on the rotary stud 13 for the customary four positions of the sensor coil 11. For the connection between the control section 5 and the fastening element 4, stops of this kind are not necessary since, with the control section 5 resting against the neck-shaped intermediate part 17, rotation is permitted only in the above-described position of the fastening element 4 with respect to the upper part 1.

There has thus been shown and described a novel initiator for a contactless switch which fulfills all the objects and advantages sought therefor. Many changes, modifications, variations and other uses and applications of the subject invention will, however, become apparent to those skilled in the art after considering this specification and the accompanying drawings which disclose the preferred embodiment thereof. All such changes, modifications, variations and other uses and applications which do not depart from the spirit and scope of the invention are deemed to be covered by the invention which is limited only by the claims which follow.

What is claimed is:

1. In an initiator for a contactless switch comprising, in combination:
    (a) a support section having a face side and a plurality of lateral sides, said support section defining a longitudinal axis substantially perpendicular to said face side;
    (b) a prism-shaped fastening element having a triangular profile formed by three sides, a first one of said three sides being mounted on said face of said support section and being selectively rotatable about said longitudinal axis, and a second of said three sides defining a central axis perpendicular thereto which is at an acute angle with respect to said longitudinal axis;
    (c) a control section having an actuation side and a bevelled side, substantially opposite said actuation side, said control section being mounted on said second side of said fastening element and being selectively rotatable about said central axis, thereby permitting said actuation side of said control section to assume different positions with respect to said front and lateral sides of said support section where it faces away from said face side or is arranged in parallel with said lateral sides;
the improvement wherein the corner of said support section between said face side and two of said lateral sides thereof is bevelled such that, after said fastening element has been rotated through a predetermined angle about said longitudinal axis, said control section can be rotated about said central axis by 180° and, thereafter, can be rotated together with said fastening element about said longitudinal axis.

2. The initiator recited in claim 1, wherein said support section comprises separable first and second parts, said first part forming said bevelled corner of said support section and said second part having a projection which fills the corner space left vacant by said bevelled corner when said first and second parts are assembled together.

3. The initiator recited in claim 2, wherein said first part supports the rotatable joint between said fastening element and said support section and wherein said second part includes stop means for blocking at least rotational movement of said fastening element with respect to said support section when said first and second parts are assembled together.

4. The initiator recited in claim 2, wherein said first part supports the rotatable joint between said fastening element and said support section and wherein said second part includes stop means for blocking at least axial movement of said fastening element in the direction of said longitudinal axis with respect to said support section when said first and second parts are assembled together.

5. The initiator recited in claim 2, wherein projections and matching recesses are provided on at least one of said first and second parts and on at least one of said control section and fastening element, respectively, to prevent relative rotational movement between said control section and fastening element, on one hand, and said support section on the other.

6. The initiator recited in claim 5, wherein said projections have a prescribed height such that said projections are removed from said recesses upon axial displacement of said fastening element in the direction of said longitudinal axis with respect to said support section by a distance greater than said height.

7. The initiator recited in claim 6, further comprising stop means for limiting said axial displacement to a distance slightly greater than said height.

8. The initiator recited in claim 1, wherein said support section has a neck-shaped intermediate portion forming said face side and facing said fastening element and said control section.

9. The initiator recited in claim 1, wherein the rotatable joints between said control section and said fastening element, and between said fastening element and said support section comprise snap connections.

10. The initiator recited in claim 1, further comprising stop means for limiting relative rotation between said fastening element and said support section.

11. The initiator recited in claim 1, further comprising stop means limiting relative rotation between said control section and said fastening element.

* * * * *